Figure 1:
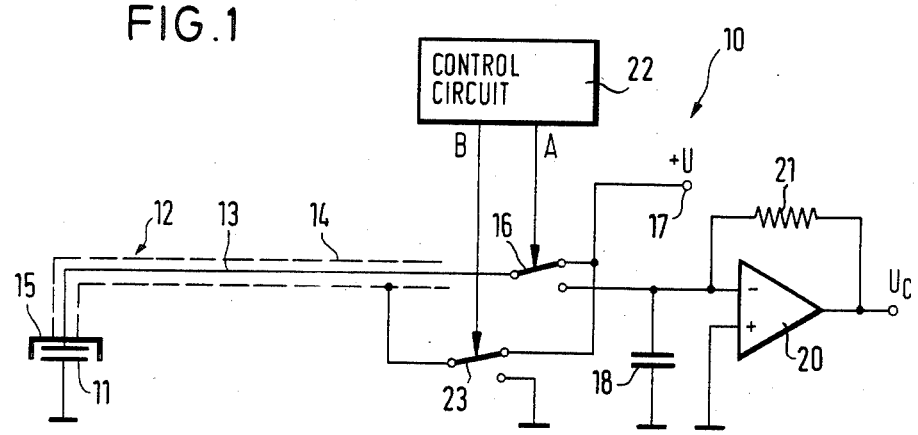

United States Patent [19]

Herzog

[11] Patent Number: 4,743,837
[45] Date of Patent: May 10, 1988

[54] CIRCUIT FOR MEASURING CAPACITANCE BY CHARGING AND DISCHARGING CAPACITOR UNDER TEST AND ITS SHIELD

[75] Inventor: Michael Herzog, Witterswil, Switzerland

[73] Assignee: Flowtec AG, Switzerland

[21] Appl. No.: 940,504

[22] Filed: Dec. 11, 1986

[30] Foreign Application Priority Data

Dec. 13, 1985 [DE] Fed. Rep. of Germany ....... 3544187

[51] Int. Cl.$^4$ ............................................. G01R 27/26
[52] U.S. Cl. ................................ 324/60 CD; 324/60 C
[58] Field of Search ............. 324/61 R, 60 CD, 60 C, 324/61 P, 60 R; 340/870.37

[56] References Cited

U.S. PATENT DOCUMENTS

| 2,923,880 | 2/1960 | Mayes | 324/57 R |
| 3,781,672 | 12/1973 | Maltby et al. | 324/61 R |
| 3,886,447 | 5/1975 | Tanaka | 324/60 CD |
| 4,187,460 | 2/1980 | Dauge et al. | 324/60 CD |

FOREIGN PATENT DOCUMENTS

| 2744785 | 4/1979 | Fed. Rep. of Germany . |
| 3143114A1 | 7/1982 | Fed. Rep. of Germany . |
| 3413849 | 8/1985 | Fed. Rep. of Germany . |
| 2087084B | 5/1982 | United Kingdom . |

OTHER PUBLICATIONS

Elektronik, 1980, No. 21, pp. 67–70.
Wireless World, May 1981, pp. 31–41.
Electronic Engineering, Feb. 1981, pp. 23–25.

Primary Examiner—Reinhard J. Eisenzopf
Assistant Examiner—Jack B. Harvey
Attorney, Agent, or Firm—Barnes & Thornburg

[57] ABSTRACT

A capacitance measuring circuit operating by the principle of switched capacitors includes a switchover device which alternately and periodically with a predetermined switchover frequency connects the measured capacitance for charging to a constant voltage and for discharging to a storage capacitor whose capacitance is large compared with the measured capacitance and whose terminal voltage is held substantially at a constant reference potential by a controlled discharge current. The magnitude of the discharge current is then proportional to the measured capacity and represents the measured value. A further switchover device applies a shield associated with the measured capacitance with the switchover frequency periodically and alternately to potentials which correspond substantially to the constant voltage and reference potential respectively. As a result, the potential of the shield is caused to follow the potential of the electrode to be shielded in accordance with the principle of "active shielding".

3 Claims, 2 Drawing Sheets

CIRCUIT FOR MEASURING CAPACITANCE BY CHARGING AND DISCHARGING CAPACITOR UNDER TEST AND ITS SHIELD

The invention relates to a capacitance measuring circuit comprising a switchover means which alternately and periodically with a predetermined switchover frequency connects the measured capacitance for charging to a constant voltage and for discharging to a storage capacitor whose capacitance is large compared with the measured capacitance and whose terminal voltage is held substantially at a constant reference potential by a controlled discharge current, the magnitude of the discharge current being proportional to the measured capacitance and representing the measured value.

Capacitance measuring circuits of this type which are known from DE-OS No. 3,143,114 operate by the principle of "switched capacitors". The capacitance measurement is based on the measurement of the mean discharge current of the measured capacitance periodically and alternately charged to a constant voltage and discharged. Generally, the mean discharge current is converted by a current-voltage converter to a voltage which is proportional to the measured capacitance. By using two circuit branches operating by the same principle it is in particular possible to measure with great sensitivity and accuracy capacitance differences between two measured capacitances even when the capacitance differences are very small compared with the measured capacitances.

On the other hand, in capacitance measurement circuits or capacitive sensors, disclosed for example in U.S. Pat. No. 3,781,672 and German Auslegeschrift 2,744,785, the principle of "active shielding" is known which resides in that the potential of a shield associated with the measured capacitance or the sensor capacitance is continuously caused to follow the potential of the electrode to be shielded. This makes it possible to eliminate the influence of stray capacitances and interference fields on the measured or sensor capacitance. The shielding can for example be a shield electrode surrounding the measuring or sensor electrode or also the shielding of a cable connecting the measured or sensor capacitance to the capacitance measuring circuit. In accordance with the prior art the active shielding is effected in that the potential of the shielded electrode is sampled and applied via an impedance converter to the shield. This solution is complicated because as impedance converter an operational amplifier is required which must meet high demands as regards speed and input capacitance.

The problem underlying the invention is to obtain an active shielding in a capacitance measuring circuit of the type set forth at the beginning in a very simple and effective manner.

To solve this problem the capacitance measuring circuit according to the invention includes a further switchover means which with the switchover frequency periodically and alternately connects a shield associated with the measured capacitance to potentials which correspond substantially to the constant voltage and the reference potential respectively.

The capacitance measuring circuit according to the invention utilizes the fact that the potential of the electrode to be shielded assumes only two alternating values, i.e. either the reference potential or the potential of the constant voltage to which the measured capacitance is charged. For this reason a sampling and feedback of the potential to be shielded is dispensed with; instead, in time with the switchover frequency the two potential values are simply alternately applied to the shield. To do this all that is needed is a further switchover means of simple type. A particular advantage found here is that there are no narrow time tolerances for the activation and response speed of the further switchover means because due to the principle of switched capacitors even considerable time displacements between the potential changes of the shielded electrode on the one hand and the shield on the other do not lead to measurement errors if certain conditions which are easy to fulfil are observed.

Figure 2:
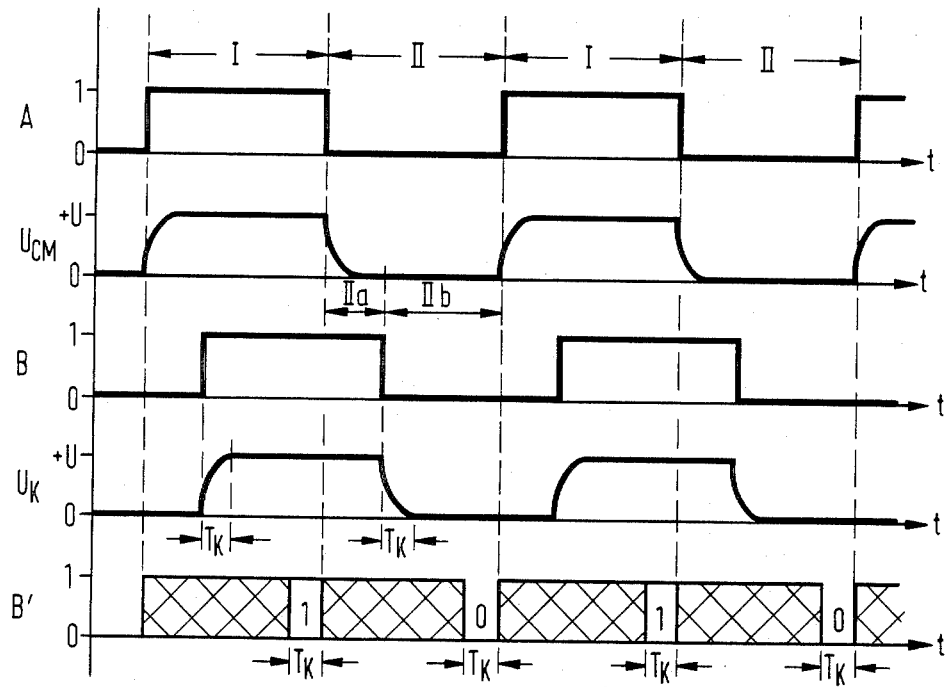
Figure 3:
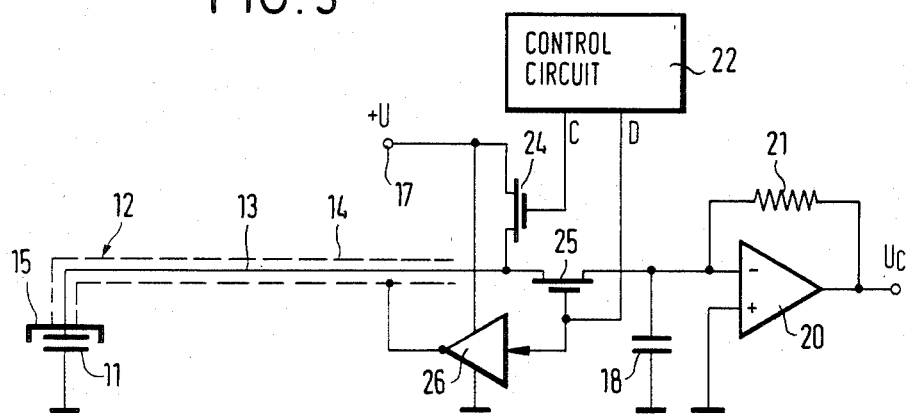
Figure 4:
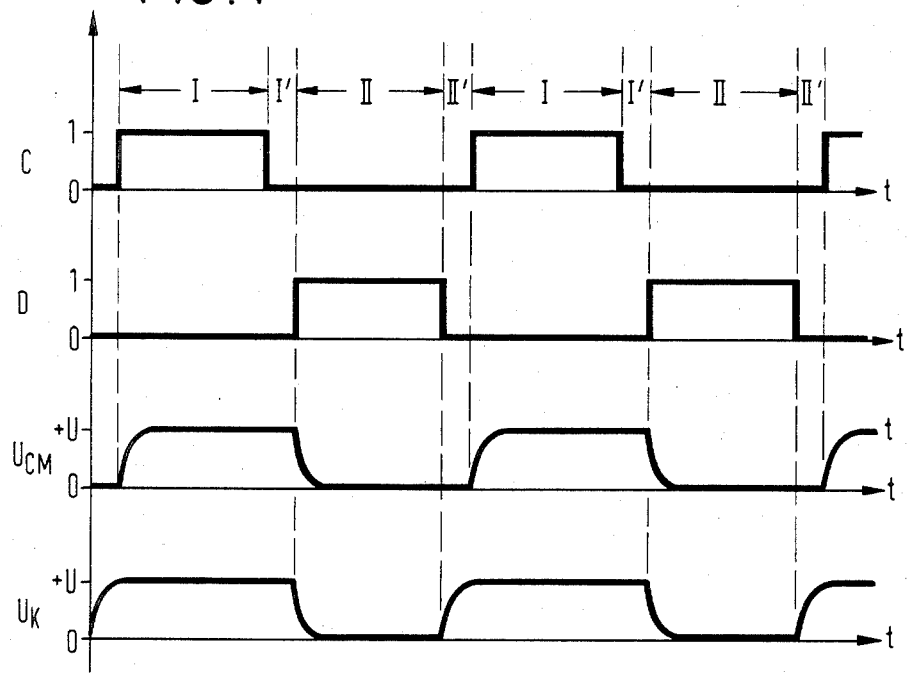

Further features and advantages of the invention will be apparent from the following description of examples of embodiment which are illustrated in the drawings, wherein:

FIG. 1 shows the basic circuit diagram of an embodiment of the capacitance measuring circuit according to the invention, FIG. 2 shows time diagrams to explain the mode of operation of the capacitance measuring circuit of FIG. 1, FIG. 3 shows the basic circuit diagram of another embodiment of the capacitance measuring circuit according to the invention and FIG. 4 shows time diagrams to explain the mode of operation of the capacitance measuring circuit of FIG. 3

The capacitance measuring circuit 10 shown in FIG. 1 furnishes by the principle of "switched capacitors" known from DE-OS No. 3,143,114 an output signal which is proportional to the capacitance $C_M$ of a test capacitor 11. The test capacitor 11 may be disposed at a relatively great distance from the capacitance measuring circuit 10 and is connected thereto via a shielded cable 12 which comprises a shielded inner conductor 13 and a cable shield 14. If a shield electrode 15 is present at the location of the test capacitor 11 said electrode is connected to the cable shield 14.

The capacitance measuring circuit 10 includes a changeover switch 16 which in the one position, illustrated in FIG. 1, connects the test capacitor 11 via the inner conductor 13 of the cable 12 to a terminal 17 which carries a positive direct voltage $+U$ with respect to ground and which is for example the operating voltage of the circuit. In the other position the switch 16 connects the test capacitor 11 to a storage capacitor 18 whose capacitance $C_0$ is very large compared with the measured capacitance $C_M$. Also connected to the interconnected terminals of the switch 16 and the storage capacitor 18 is the inverting input of an operational amplifier 20 whose non-inverting input is connected to ground and whose feedback circuit between the output and the inverting input includes a resistor 21.

The changeover switch 16 is actuated by a control signal A which is emitted at an output of a control circuit 22. The control circuit 22 furnishes at a second output a control signal B which actuates a changeover switch 23 which applies the cable shield 14 of the cable 12 in the one position to the voltage $+U$ of the terminal 17 and in the other position to ground.

The mode of operation of the capacitance measuring circuit of FIG. 1 will be explained with the aid of the time diagrams of FIG. 2.

The diagram A of FIG. 2 shows the time variation of the control signal A which actuates the changeover switch 16. The control signal A assumes periodically and alternately two states 0 or 1 and it is assumed that the switch 16 for the value 1 of the control signal A has the position shown in FIG. 1 in which it connects the test capacitor 11 to the terminal 17 whilst for the value 0 of the control signal A it separates the test capacitor 11 from the terminal 17 and connects it instead to the storage capacitor 18.

The diagram $U_{CM}$ of FIG. 2 shows the time variation of the voltage at the test capacitor 11 and thus also the voltage on the inner conductor 13 of the cable 12.

In each phase I, corresponding to the value 1 of the control signal A, the test capacitor 11 is charged to the voltage $+U$. Because of the unavoidable time constant of the charging circuit the charging does not take place without delay but the duration of the phase I is made large enough to be sure that the voltage $U_{CM}$ at the test capacitor 11 is certain to reach the full value U.

In the phase II, which corresponds to the value 0 of the control signal A, the test capacitor $C_M$ discharges with the corresponding time constant to the storage capacitor 18. Since the capacitance $C_0$ of the storage capacitor 18 is very large compared with the measured capacitance $C_M$, the voltage at said two capacitors after the charge equalization is very small compared with the voltage $+U$. The duration of the phase II, which is preferably equal to the duration of the phase I, is so dimensioned that the complete charge equalization is certain to take place.

In the following phase I the test capacitor 11 is again charged to the voltage $+U$ whilst the charge of the storage capacitor 18 is slowly led off through the operational amplifier 20 acting as current-voltage converter. The charge equalization is effected by a current which flows via the resistor 21 and results in the voltage at the storage capacitor 18 being held on average substantially at the value zero. The current flowing via the resistor 21 is equal to the mean value of the current discharged by the test capacitor 11. To maintain this current the output voltage of the operational amplifier 20 assumes a value $U_C$ which is exactly proportional to the test capacitance $C_M$.

If no particular precautions are taken the cable capacitance $C_K$ of the shielded cable 12 adds itself onto the measured capacitance $C_M$ and the capacitance changes of the cable affect the measurement. To eliminate the influence of the cable capacitance in the capacitance measuring circuit of FIG. 1 an active shield is used in that the potential of the cable shield 14 is made to follow the potential on the shielded inner conductor 13 of the cable 12. If in addition a shield electrode 15 is present and is connected to the cable shield 14, by the active shielding the potential of the shield electrode 15 is caused to follow the potential of the capacitor electrode shielded thereby, the influence of stray capacitances and interference fields on the measured capacitance thus being eliminated. According to the prior art such an active shielding is carried out in that the potential of the shielded line is continuously sampled and applied via an impedance converter to the shield. In contrast, in the capacitance measuring circuit of FIG. 1 the active shielding is effected in a particularly simple and effective manner with the aid of the changeover switch 23 actuated by the control signal B without any feedback of the potential of the shielded line being necessary.

The diagram B of FIG. 2 shows the time variation of the control signal B which with the same recurrence frequency as the control signal A periodically alternately assumes the values 0 and 1. The diagram $U_K$ of FIG. 2 show the time variation of the voltage which is applied by the switch 23 to the cable shield 14. When the control signal B assumes the value 1 the cable shield 14 is applied to the voltage $+U$ and the voltage $U_K$ reaches the voltage value $+U$ after a recharge time $T_K$ governed by the time constant. When the control signal B assumes the value 0 the cable shield 14 is applied to ground potential and the voltage $U_K$ reaches the voltage value 0 again after the recharge time $T_K$.

The following is apparent from the diagram of FIG. 2: If the control signals A and B are exactly in-phase the voltages $U_{CM}$ and $U_K$ also have substantially the same time variation. This fulfils the condition of active shielding that the potential of the shield continuously follows the potential of the shielded electrode. However, in FIG. 2 the control signals A and B are deliberately shown phase-displaced with respect to each other to illustrate that it is not essential to maintain exact time relationships. Although there is then in each phase II at the start a time portion IIa in which the test capacitor 11 is already discharging to the storage capacitor 18 whilst the voltage $+U$ is still applied to the cable shield so that the cable capacitance $C_K$ is being charged and the corresponding charge $Q_K$ is flowing to the storage capacitor 18, when in the subsequent section IIb of the same phase II the cable shield 14 is applied to ground whilst the shielded conductor 13 is still connected to the storage capacitor 18 substantially the same charge $Q_K$ flows back again from the storage capacitor 18 to the cable capacitance $C_K$. Thus, on an average these charge displacements cancel each other out so that on the storage capacitor 18 effectively only the charge $Q_M$ of the test capacitor 11 to be detected remains. Thus, the charge $Q_M$ alone is decisive for the current flowing through the resistor 21 and thus for the voltage $U_C$ at the output of the operational amplifier 20.

The requirements regarding the time location of the control signal B with respect to the control signal A are thus not critical. It is merely necessary to observe the time conditions that the shield voltage $U_K$ before the start of each phase II must have reached the voltage value $+U$ and before the start of each phase I the voltage value 0. Taking account of the recharge time $T_K$ this means that the control signal B must be brought to the value 1 at the latest a time $T_K$ before the start of each phase II and must be brought to the value 0 at the latest the time $T_K$ before the start of each phase I. This gives the time conditions illustrated in diagram B′: The control signal B can have any values in the cross-hatched regions and must have the specified signal values only in the regions of the duration $T_K$ marked by "1" and "0" respectively.

As already mentioned the capacitance $C_0$ of the storage capacitor 18 should be as large as possible compared with the measured capacitance $C_M$. The ratio $C_0/C_M$ can in practice reach the value 1000. Since however there is a limit to the magnitude of this ratio, on charge transfer from the test capacitor 11 to the storage capacitor 18 in the phase II the voltage at the storage capacitor 18 will increase somewhat due to the charge $Q_2$ originating from the test capacitor 11. Accordingly, in the portion IIb of the phase II the charge flowing back to the cable capacitance $C_K$ is not exactly the complete charge $Q_K$ but is somewhat less. The reduction of the effective cable capacitance thus corresponds to a first approximation to the ratio $C_0$ to $C_K$ but the residual error is negligible.

The changeover switches 16 and 23 are represented only symbolically in FIG. 1 as mechanical switches. In reality these are highspeed electronic switches, for example MOS field-effect transistors. Since such electronic switches do not act as changeover switches but as simple on-off switches, each changeover switch of FIG. 1 must be replaced by two such electronic switches. FIG. 3 illustrates a capacitance measuring circuit made using electronic switches and FIG. 4 shows the corresponding time diagrams.

Insofar as the components of the capacitance measuring circuit of FIG. 3 correspond to those of the embodiment of FIG. 1, the same reference numerals have been used. The capacitance measuring circuit of FIG. 3 differs from the embodiment of FIG. 1 primarily in that the changeover switch 16 is replaced by two MOS field-effect transistors 24 and 25 which are driven by control signals C and D respectively which are furnished by the control circuit 22. The time variation of the control signals C, D is illustrated in the diagram designated by the same letters in FIG. 4. Each of the two control signals C and D periodically alternately assumes the signal value 0 and the signal value 1, the two control signals being substantially opposite in phase to each other. Each MOS field-effect transistor 24, 25 is conductive for the value 1 of the applied control signal and non-conductive for the value 0 of the applied control signal. In the phase I the control signal C has the value 1 and the control signal D the value 0. Accordingly, in the phase I the test capacitor 11 is connected to the terminal 17 and separated from the storage capacitor 18. This corresponds to the first position which the switch 16 of FIG. 1 assumes in phase I of FIG. 2. In phase II of FIG. 4 the control signal C has the value 0 and the control signal D the value 1 so that the test capacitor 11 is separated from the terminal 17 and connected to the storage capacitor 18. This corresponds to the other position which the switch 16 of FIG. 1 assumes in phase II of FIG. 2. Thus, the circuit arrangement of FIG. 3 results as regards the charging and discharging of the test capacitor 11 in phases I and II in the same effect as the circuit arrangement of FIG. 1.

However, in accordance with the time diagrams of FIG. 4 between each phase I and the following phase II an intermediate phase I' is inserted and between each phase II and the following phase I an intermediate phase II' in which the two control signals C and D have the value 0 so that the two MOS field-effect transistors 24 and 25 are simultaneously blocked. These intermediate phases are relatively short and intended to ensure that the two MOS field-effect transistors do not carry current simultaneously because then the storage capacitor 18 would be momentarily applied directly to the voltage +U.

The diagram $U_{CM}$ of FIG. 4 shows the time variation of the voltage $U_{CM}$ at the test capacitor 11 obtained by the previously described driving of the MOS field-effect transistors 24, 25 by means of the control signals C, D.

The switch 23 of FIG. 1 could be replaced in identical manner by two MOS field-effect transistors. FIG. 3 shows however another solution which results in a further simplification. Here, the switch 23 is replaced by an inverter 26 which acts as threshold value discriminator and the current supply terminals of which are connected to the voltage +U and ground respectively. The control signal B is applied to the signal input of the inverter 26 and the output of the latter is connected to the cable shield 14. The inverter 26 is made in the usual manner so that its output voltage assumes the higher supply voltage potential when its input signal lies beneath a predetermined threshold value, i.e. in particular has the value 0, and its output voltage assumes the lower supply voltage potential when its input signal lies above the threshold value, i.e. in particular has the value 1. In practice the two electronic switches forming together the changeover switch are contained in the inverter and so arranged that they connect the output of the inverter either to the one or the other supply voltage terminal. In the capacitance measuring circuit of FIG. 3 the output voltage of the inverter 26 thus assumes the value +U when the control signal B has the value 0 and assumes the ground potential when the control signal B has the value 1. Accordingly, the voltage $U_K$ at the cable shield 14 connected to the output of the inverter 26 exhibits the time variation illustrated in the diagram $U_K$ of FIG. 4. It is immediately apparent that this time variation fulfils the previously explained conditions for the active shielding without having to observe narrow time tolerances for the activation of the inverter 26 or the response speed thereof.

I claim:

1. Capacitance measuring circuit comprising a switchover means which alternately and periodically with a predetermined switchover frequency connects the measured capacitance for charging to a constant voltage and for discharging to a storage capacitor whose capacitance is large compared with the measured capacitance and whose terminal voltage is held substantially at a constant reference potential by a controlled discharge current, the magnitude of the discharge current being proportional to the measured capacitance and representing the measured value, characterized by a further switchover means which with the switchover frequency periodically and alternately connects a shield associated with the measured capacitance to potentials which correspond substantially to the constant voltage and the reference potential respectively.

2. Capacitance measuring circuit according to claim 1, characterized in that each switchover means is formed by two electronic switches which are opened or closed by opposite phase control signals.

3. Capacitance measuring circuit according to claim 2, characterized in that the further switchover means is formed by a threshold value discriminator which receives one of the opposite phase control signals.

* * * * *